(12) United States Patent
Kuntzman et al.

(10) Patent No.: US 11,772,961 B2
(45) Date of Patent: Oct. 3, 2023

(54) MEMS DEVICE WITH PERIMETER BAROMETRIC RELIEF PIERCE

(71) Applicant: Knowles Electronics, LLC, Itasca, IL (US)

(72) Inventors: Michael Kuntzman, Chicago, IL (US);
Ken Deng, Schaumburg, IL (US);
Faisal Zaman, Naperville, IL (US);
Bing Yu, Elk Grove Village, IL (US);
Vahid Naderyan, Chicago, IL (US);
Peter V. Loeppert, Durand, IL (US)

(73) Assignee: KNOWLES ELECTRONICS, LLC, Itasca, IL (US)

( * ) Notice: Subject to any disclaimer, the term of this patent is extended or adjusted under 35 U.S.C. 154(b) by 203 days.

(21) Appl. No.: 17/412,887

(22) Filed: Aug. 26, 2021

(65) Prior Publication Data

US 2023/0062556 A1    Mar. 2, 2023

(51) Int. Cl.
*B81B 7/00*    (2006.01)

(52) U.S. Cl.
CPC .... *B81B 7/0041* (2013.01); *B81B 2201/0257* (2013.01); *B81B 2203/0127* (2013.01); *B81B 2203/0353* (2013.01); *B81B 2207/093* (2013.01)

(58) Field of Classification Search
None
See application file for complete search history.

(56) References Cited

U.S. PATENT DOCUMENTS

| | | | |
|---|---|---|---|
| 4,154,115 A | 5/1979 | Hartung et al. | |
| 4,435,986 A | 3/1984 | Choffat | |
| 6,075,867 A | 6/2000 | Bay et al. | |
| 6,431,003 B1 | 8/2002 | Stark et al. | |
| 6,435,033 B2 | 8/2002 | Delaye | |
| 6,535,460 B2 | 3/2003 | Loeppert et al. | |

(Continued)

FOREIGN PATENT DOCUMENTS

CN    103344377 A    10/2013
KR    100571967 B1    4/2006

(Continued)

OTHER PUBLICATIONS

Andrews et al., "A comparison of squeeze-film theory with measurements on a microstructure," Sensors and Actuators A 36 (1993) 79-87, 9 pages.

(Continued)

*Primary Examiner* — Erik T. K. Peterson
*Assistant Examiner* — Christopher A. Schodde
(74) *Attorney, Agent, or Firm* — FLENER IP & BUSINESS LAW; Zareefa B. Flener; Ayhan E. Mertogul

(57) ABSTRACT

A microelectromechanical systems (MEMS) die includes a first diaphragm and a second diaphragm, wherein the first diaphragm and the second diaphragm bound a sealed chamber. A stationary electrode is disposed within the sealed chamber between the first diaphragm and the second diaphragm. A tunnel passes through the first diaphragm and the second diaphragm without passing through the stationary electrode, wherein the tunnel is sealed off from the chamber. The MEMS die further includes a substrate having an opening formed therethrough, wherein the tunnel provides fluid communication from the opening, through the second diaphragm, and through the first diaphragm.

18 Claims, 11 Drawing Sheets

(56) References Cited

U.S. PATENT DOCUMENTS

| | | |
|---|---|---|
| 6,571,445 B2 | 6/2003 | Ladabaum |
| 6,662,663 B2 | 12/2003 | Chen |
| 7,030,407 B2 | 4/2006 | Michler |
| 7,040,173 B2 | 5/2006 | Dehe |
| 7,124,638 B2 | 10/2006 | Kandler |
| 7,150,195 B2 | 12/2006 | Jacobsen et al. |
| 7,190,038 B2 | 3/2007 | Dehe et al. |
| 7,470,546 B2 | 12/2008 | Lehmann |
| 7,489,593 B2 | 2/2009 | Nguyen-Dinh et al. |
| 7,535,156 B2 | 5/2009 | Kvisteroy et al. |
| 7,545,012 B2 | 6/2009 | Smith et al. |
| 7,781,249 B2 | 8/2010 | Laming et al. |
| 7,793,550 B2 | 9/2010 | Elian et al. |
| 7,795,695 B2 | 9/2010 | Weigold et al. |
| 7,825,484 B2 | 11/2010 | Martin et al. |
| 7,829,961 B2 | 11/2010 | Hsiao |
| 7,903,831 B2 | 3/2011 | Song |
| 7,918,135 B2 | 4/2011 | Hammerschmidt |
| 8,127,619 B2 | 3/2012 | Hammerschmidt |
| 8,339,764 B2 | 12/2012 | Steeneken et al. |
| 8,461,655 B2 | 6/2013 | Klein et al. |
| 8,575,037 B2 | 11/2013 | Friza et al. |
| 8,650,963 B2 | 2/2014 | Barr et al. |
| 8,723,277 B2 | 5/2014 | Dehe et al. |
| 8,809,973 B2 | 8/2014 | Theuss |
| 8,969,980 B2 | 3/2015 | Lee |
| 8,989,411 B2 | 3/2015 | Hall et al. |
| 9,031,266 B2 | 5/2015 | Dehe et al. |
| 9,179,221 B2 | 11/2015 | Barzen et al. |
| 9,181,080 B2 | 11/2015 | Dehe et al. |
| 9,237,402 B2 | 1/2016 | Loeppert |
| 9,321,630 B2 | 4/2016 | Xu et al. |
| 9,332,330 B2 | 5/2016 | Elian et al. |
| 9,380,381 B2 | 6/2016 | Straeussnigg et al. |
| 9,383,282 B2 | 7/2016 | Besling et al. |
| 9,383,285 B2 | 7/2016 | Phan Le et al. |
| 9,425,757 B2 | 8/2016 | Straeussnigg et al. |
| 9,432,759 B2 | 8/2016 | Elian et al. |
| 9,438,979 B2 | 9/2016 | Dehe |
| 9,510,107 B2 | 11/2016 | Dehe et al. |
| 9,516,428 B2 | 12/2016 | Dehe et al. |
| 9,549,263 B2 | 1/2017 | Uchida |
| 9,550,211 B2 | 1/2017 | Dirksen et al. |
| 9,631,996 B2 | 4/2017 | Wiesbauer et al. |
| 9,689,770 B2 | 6/2017 | Hammerschmidt |
| 9,828,237 B2 | 11/2017 | Walther et al. |
| 9,884,757 B2 | 2/2018 | Winkler et al. |
| 9,903,779 B2 | 2/2018 | Hammerschmidt |
| 9,942,677 B2 | 4/2018 | Wiesbauer et al. |
| 9,986,344 B2 | 5/2018 | Dehe et al. |
| 10,129,676 B2 | 11/2018 | Walther et al. |
| 10,231,061 B2 | 3/2019 | Dehe et al. |
| 10,322,481 B2 | 6/2019 | Dehe et al. |
| 10,433,070 B2 | 10/2019 | Dehe et al. |
| 10,560,771 B2 | 2/2020 | Dehe et al. |
| 10,582,306 B2 | 3/2020 | Dehe |
| 10,589,990 B2 | 3/2020 | Dehe et al. |
| 10,641,626 B2 | 5/2020 | Bretthauer et al. |
| 10,669,151 B2 | 6/2020 | Strasser et al. |
| 10,676,346 B2 | 6/2020 | Walther et al. |
| 10,689,250 B2 | 6/2020 | Fueldner et al. |
| 10,715,926 B2 | 7/2020 | Bretthauer et al. |
| 10,939,214 B2 | 3/2021 | Kuntzman et al. |
| 2005/0177045 A1 | 8/2005 | Degertekin et al. |
| 2005/0207605 A1 | 9/2005 | Dehe et al. |
| 2005/0219953 A1 | 10/2005 | Bayram et al. |
| 2007/0205492 A1 | 9/2007 | Wang |
| 2007/0278501 A1 | 12/2007 | Macpherson et al. |
| 2008/0175425 A1 | 7/2008 | Roberts et al. |
| 2008/0212807 A1* | 9/2008 | Wang ............... H04R 17/00 310/322 |
| 2008/0267431 A1 | 10/2008 | Leidl et al. |
| 2008/0279407 A1 | 11/2008 | Pahl |
| 2008/0283942 A1 | 11/2008 | Huang et al. |
| 2009/0001553 A1 | 1/2009 | Pahl et al. |
| 2009/0180655 A1 | 7/2009 | Tien et al. |
| 2010/0046780 A1 | 2/2010 | Song |
| 2010/0052082 A1 | 3/2010 | Lee et al. |
| 2010/0128914 A1 | 5/2010 | Khenkin |
| 2010/0170346 A1 | 7/2010 | Opitz et al. |
| 2010/0173437 A1 | 7/2010 | Wygant et al. |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2013/0001550 A1 | 1/2013 | Seeger et al. |
| 2014/0071642 A1 | 3/2014 | Theuss |
| 2015/0090043 A1 | 4/2015 | Ruhl et al. |
| 2015/0247879 A1 | 9/2015 | Meinhold |
| 2015/0296307 A1 | 10/2015 | Shao et al. |
| 2016/0096726 A1 | 4/2016 | Dehe et al. |
| 2018/0091906 A1 | 3/2018 | Khenkin et al. |
| 2018/0234774 A1 | 8/2018 | Walther et al. |
| 2018/0317022 A1 | 11/2018 | Evans et al. |
| 2019/0112182 A1* | 4/2019 | Metzger-Brueckl .................. B81C 1/00293 |
| 2019/0181776 A1 | 6/2019 | Tumpold et al. |
| 2019/0246459 A1 | 8/2019 | Tumpold et al. |
| 2019/0270639 A1 | 9/2019 | Lorenz et al. |
| 2019/0331531 A1 | 10/2019 | Glacer et al. |
| 2019/0339193 A1 | 11/2019 | Eberl et al. |
| 2019/0352175 A1 | 11/2019 | Tumpold et al. |
| 2019/0363757 A1 | 11/2019 | Mikolajczak et al. |
| 2020/0057031 A1 | 2/2020 | Theuss et al. |
| 2020/0107130 A1* | 4/2020 | Cheng .................. H04R 31/003 |

FOREIGN PATENT DOCUMENTS

| | | |
|---|---|---|
| WO | 2012085335 A1 | 6/2012 |
| WO | 2019023409 A1 | 1/2019 |

OTHER PUBLICATIONS

Bay et al., "Design of a silicon microphone with differential read-out of a sealed double parallel-plate capacitor," Sensors and Acutators A 53 (1996), pp. 232-236, 5 pages.

Hansen et al., "Wideband micromachined capacitive microphones with radio frequency detection," J. Acoust. Soc. Am. 116 (2), Aug. 2004, pp. 828-842, 15 pages.

Lin, Der-Song, "Interface Engineering of Capacitive Micromachined Ultrasonic Transducers for Medical Applications," A Dissertation Submitted to the Department of Mechanical Engineering and the Committee on Graduate Studies of Stanford University in Partial Fulfillment of the Requirements for the Degree of Doctor of Philosophy, Jun. 2011, 168 pages.

Park et al., "Fabrication of Capacitive Micromachined Ultrasonic Transducers via Local Oxidation and Direct Wafer Bonding," Journal of Microelectromechanical Systems, vol. 20, No. 1, Feb. 2011, 10 pages.

Krzysztof Iniewski, "Smart Sensors for Industrial Applications," Figure 19. 1, p. 306, 1 page (2013).

Wygant et al., "50 kHz Capacitive Micromachined Ultrasonic Transducers for Generation of Highly Directional Sound with Parametric Arrays," IEEE Transactions on Ultrasonics, Ferroelectrics, and Frequency Control, vol. 56, No. 1, Jan. 2009, pp. 193-203, 11 pages.

* cited by examiner

MEMS DEVICE WITH PERIMETER BAROMETRIC RELIEF PIERCE

FIELD OF THE DISCLOSURE

The present disclosure relates generally to a microelectromechanical systems (MEMS) die, and more particularly to a MEMS die having a diaphragm including a perimeter barometric relief pierce.

BACKGROUND

It is known that in the fabrication of MEMS devices often a plurality of devices are manufactured in a single batch process wherein individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes use as an acoustic transducer or other portion of a microphone.

Vacuum sealed dual diaphragms can include a pierce structure that provides barometric relief across the diaphragm. The pierce structure typically passes through the center or active electrode region of the diaphragm, which can result in both reduced sensitivity and a high robustness risk. A need exists for forming the barometric relief pierce outside of the active electrode region, which can result in higher sensitivity, for example, higher capacitance and compliance. A further need exists to diminish the robustness risk associated with the pierce structure by forming the barometric relief pierce through a region of the diaphragm that is not mechanically active and where the pierce structure may or may not pass through the vacuum cavity of the diaphragm.

DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope.

Figure 1:
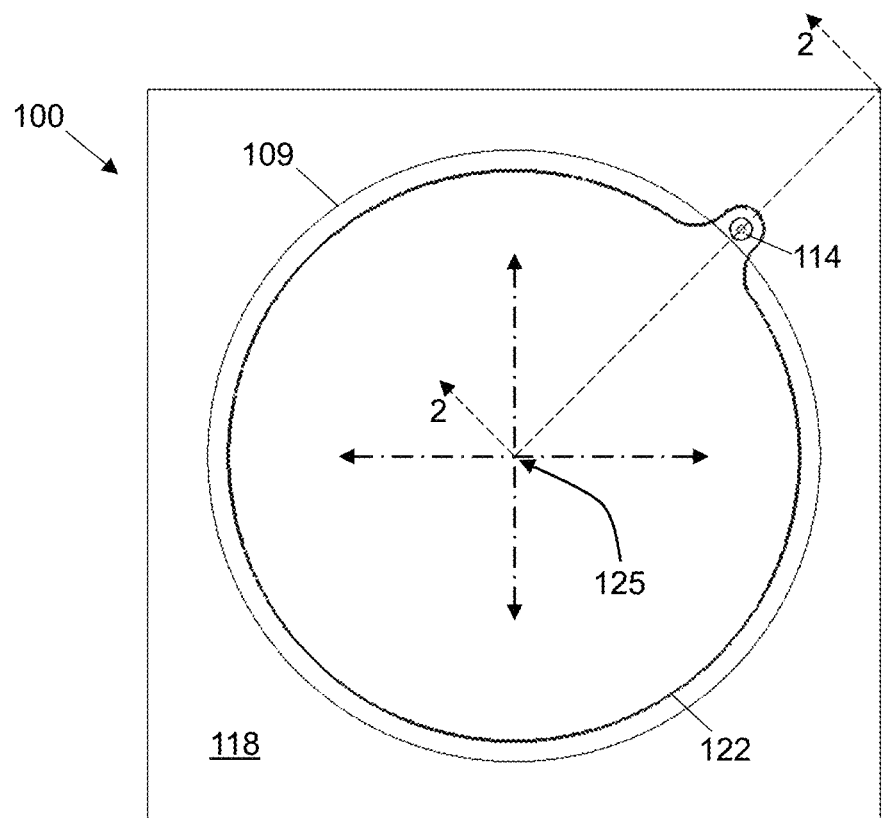
FIG. 1 is a top plan schematic view of a MEMS die, according to an embodiment.

In the following detailed description, various embodiments are described with reference to the appended drawings. The skilled person will understand that the accompanying drawings are schematic and simplified for clarity. Like reference numerals refer to like elements or components throughout. Like elements or components will therefore not necessarily be described in detail with respect to each figure.

DETAILED DESCRIPTION

According to various embodiments described herein, a MEMS die comprises a first diaphragm and a second diaphragm, wherein the first diaphragm and the second diaphragm bound a sealed chamber. A stationary electrode assembly is disposed within the sealed chamber between the first diaphragm and the second diaphragm. The stationary electrode assembly can be relatively thick and/or stiff compared to the first and second diaphragms, for example by being fabricated using thicker materials or using thin very high stress films to maintain sufficient rigidity. The stationary electrode assembly remains relatively motionless when the first and second diaphragms are deflected. A tunnel passes through the first diaphragm and the second diaphragm without passing through the stationary electrode, wherein the tunnel is sealed off from the chamber. The MEMS die further includes a substrate having an opening formed therethrough, wherein the tunnel provides fluid communication from the opening, through the second diaphragm, and through the first diaphragm. The first diaphragm comprises a movable electrode and the second diaphragm comprises a movable electrode. The tunnel is located farther out from a center of the MEMS die than an outer edge of the stationary electrode.

According to an embodiment, the opening of the substrate is at least partially aligned with the tunnel. In an embodiment the opening of the substrate is offset from the tunnel. In an embodiment the pressure within the sealed chamber is below 10,000 Pa. In an embodiment the substrate is coupled to the second diaphragm via sacrificial material, and in another embodiment the second diaphragm is attached directly to the substrate. In an embodiment the tunnel is defined by a wall, and at least a portion of the wall is surrounded by sacrificial material. In an embodiment an opening of the tunnel in one or both of the first and second diaphragms is restricted by a series of holes or slots in the second diaphragm.

According to an embodiment, the stationary electrode includes a plurality of apertures disposed therethrough, and the MEMS die further comprises a plurality of pillars, each having a first end connected to the first diaphragm and a second end connected to the second diaphragm, each pillar passing through an aperture of the plurality of apertures.

In an embodiment, the first diaphragm comprises an extension that extends beyond the perimeter of the stationary electrode, the second diaphragm comprises an extension that extends beyond the perimeter of the stationary electrode, and the tunnel passes through the extension of the first diaphragm and the extension of the second diaphragm. In an embodiment the perimeters of the first and second diaphragms except for the extensions are both within the perimeter of the stationary electrode.

According to an embodiment, the stationary electrode has a cutout, wherein the perimeter of the stationary electrode on the cutout is inside the perimeter of the first diaphragm and is inside the perimeter of the second diaphragm, and the tunnel extends through the cutout. In an embodiment the tunnel is one of a plurality of tunnels, the stationary electrode has a plurality of cutouts, wherein the perimeter of the stationary electrode on the cutouts is inside the perimeter of the first diaphragm and inside the perimeter of the second diaphragm, and each of the plurality of tunnels passes through a cutout of the plurality of cutouts.

According to an embodiment, a MEMS die comprises a first diaphragm and a second diaphragm, wherein the first diaphragm and the second diaphragm bound a sealed chamber. The MEMS die further comprises a substrate having an opening formed therethrough. A spacer is disposed between the second diaphragm and the substrate, the spacer having a channel defined therethrough that provides fluid communication between the opening and a region external to the MEMS die. In an embodiment the spacer is made of sacrificial material.

Figure 2:
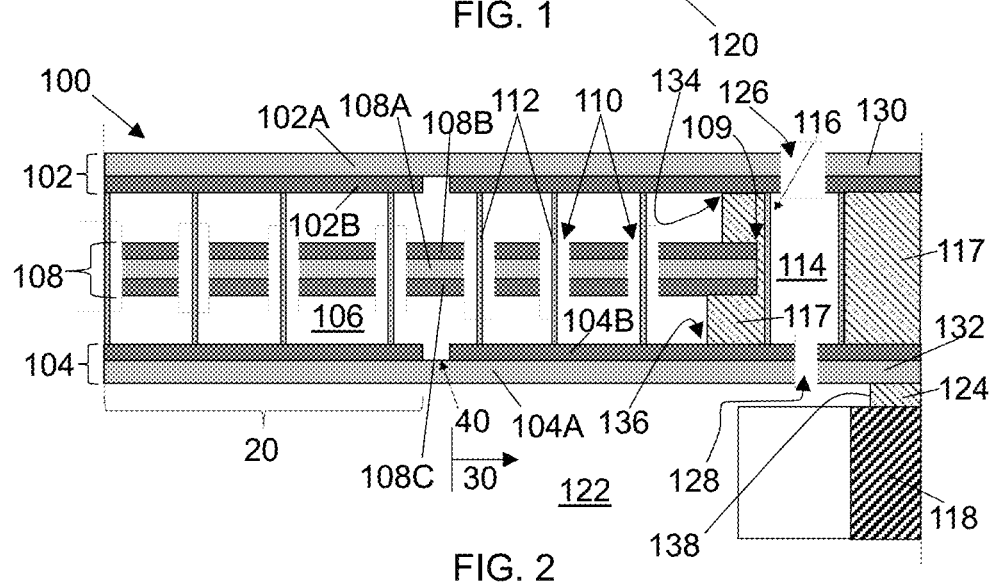
FIG. 2 is a cross-sectional schematic view of the MEMS die of FIG. 1 taken generally along the lines 2-2 of FIG. 1.

Turning to FIGS. 1 and 2, a MEMS die 100 according to an embodiment is shown schematically. The MEMS die 100 is shown in a top plan view in FIG. 1. FIG. 2 illustrates the MEMS die 100 in a cross-sectional view taken generally along the lines 2-2 of FIG. 1. Referring first to FIG. 2, in an embodiment the MEMS die 100 includes a first diaphragm 102 and a second diaphragm 104. The first diaphragm 102 and the second diaphragm 104 bound a sealed chamber 106.

According to an embodiment, the first diaphragm 102 includes an insulative layer 102A and a conductive layer 102B, and the second diaphragm 104 includes an insulative layer 104A and a conductive layer 104B. The electrically active region of the conductive layer 102B of the first diaphragm 102 may be referred to as a first movable electrode. Similarly, the electrically active region of the conductive layer 104B of the second diaphragm 104 may be referred to as a second movable electrode.

A stationary electrode assembly 108 is disposed within the sealed chamber 106 between the first diaphragm 102 and the second diaphragm 104. In an embodiment the first and second diaphragms 102, 104 extend over the entire substrate 118. In other embodiments the first and second diaphragms 102, 104 extend over a portion but not all of the substrate 118. A mechanically active area for each of the first and second diaphragms 102, 104 is defined by the innermost radial boundary (the release front) of material 117 disposed between the stationary electrode assembly 108 and each diaphragm. In an embodiment, the material 117 disposed between the stationary electrode assembly 108 and each diaphragm can be a sacrificial material that can, for example, be made of any insulative material as described hereinbelow.

The stationary electrode assembly 108 includes an insulative layer 108A, a first conductive layer 108B, and a second conductive layer 108C. The insulative layer 108A is sandwiched between the first conductive layer 108B and the second conductive layer 108C. In one embodiment, the first conductive layer 108B and the second conductive layer 108C are shorted together so as to form a single electrode (also referred to herein as a stationary electrode), which faces the first movable electrode and faces the second movable electrode. In another embodiment, the first conductive layer 108B and the second conductive layer 108C are electrically isolated from one another, and may be respectively referred to as a first stationary electrode (which faces the first movable electrode) and a second stationary electrode (which faces the second movable electrode). In an embodiment, the stationary electrode assembly 108 is relatively thick and/or stiff compared to the first and second diaphragms 102 and 104, for example by being fabricated using thicker materials or using thin very high stress films to maintain sufficient rigidity. The stationary electrode assembly 108 remains relatively motionless when the first and second diaphragms 102 and 104 are deflected.

The material of any of the insulative layers 102A, 104A, and 108A can be any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. Similarly, the material of any of the conductive layers 102B, 104B, 108B, and 108C can be any conductive material that would not be damaged during a sacrificial layer removal process. For example, without limitation, the conductive material can be polycrystalline silicon, one or more metals, alloys of metals, carbon, materials that are not damaged by a sacrificial layer removal process, and combinations thereof.

The structural geometry of materials comprising the first and second diaphragms 102 and 104 and the stationary electrode assembly 108 can be other than those described hereinabove in other embodiments.

The sealed chamber 106 in some embodiments is a low pressure region having a pressure below atmospheric pressure. In an embodiment the sealed chamber 106 has an internal pressure, for example, of less than 100,000 Pa. In another embodiment the sealed chamber 106 has an internal pressure of less than 10,000 Pa. In a further embodiment the sealed chamber 106 has an internal pressure of less than 1,000 Pa, and in yet another embodiment the sealed chamber 106 has an internal pressure of less than 100 Pa.

In an embodiment the stationary electrode assembly 108 includes a plurality of apertures 110 disposed therethrough (i.e., the apertures are disposed through the stationary electrode or through the first and second stationary electrodes). In an embodiment a plurality of pillars 112 connects the first diaphragm 102 to the second diaphragm 104, wherein each pillar 112 has a first end connected to the first diaphragm 102 and a second end connected to the second diaphragm 104, and wherein each pillar 112 passes through an aperture 110 of the plurality of apertures 110. An outer edge 109 of the stationary electrode assembly 108 in an embodiment is illustrated in FIG. 1.

Referring to FIGS. 1 and 2, in an embodiment a tunnel 114 passes through the first diaphragm 102 and the second diaphragm 104 without passing through the stationary electrode assembly 108 (i.e., without passing through a stationary electrode), wherein the tunnel 114 does not pass through the sealed chamber 106. In this embodiment the tunnel 114 passes through the first and second diaphragms 102, 104 geometrically adjacent to and sealed off from the sealed chamber 106. In another embodiment, for example, see FIGS. 10A and 10B, in addition to passing through the first and second diaphragms 102, 104 without passing through the stationary electrode assembly 108, the tunnel 114 does pass through the sealed chamber 106 while being sealed off from the sealed chamber 106.

In an embodiment the tunnel 114 is defined by a side wall 116 and in another embodiment at least a portion of the side wall 116 is surrounded by sacrificial material 117. The sacrificial material 117 can, for example, be made of any insulative material as described hereinabove. The pillars 112, the side wall 116 (and the side wall 115 described hereinbelow) can all made of any insulative material that would not be damaged during a sacrificial layer removal process. For example, without limitation, the insulative material can be silicon nitride, silicon oxynitride, metal oxides, polymers, materials that are not damaged by a sacrificial layer removal process, and combinations thereof. In an embodiment as illustrated in FIG. 1, the tunnel 114 is located farther out from a center 125 of the MEMS die 100 than the outer edge 109 of the stationary electrode assembly 108.

Referring to FIGS. 1 and 2, in an embodiment the MEMS die 100 includes a substrate 118 having an outer boundary 120 as indicated in FIG. 1. In an embodiment the substrate 118 has a generally rectangular perimeter, but in other embodiments it can be any shape. The substrate 118 in an embodiment includes an opening 122 formed therethrough. As can be seen in FIG. 2, in an embodiment, a first end of the tunnel 114 includes a pierce 126 disposed through the first diaphragm 102 and a second end the tunnel 114 includes a pierce 128 disposed through the second diaphragm 104. The tunnel 114 provides fluid communication from the opening 122, through the second diaphragm 104, and through the first diaphragm 102.

Figure 3:
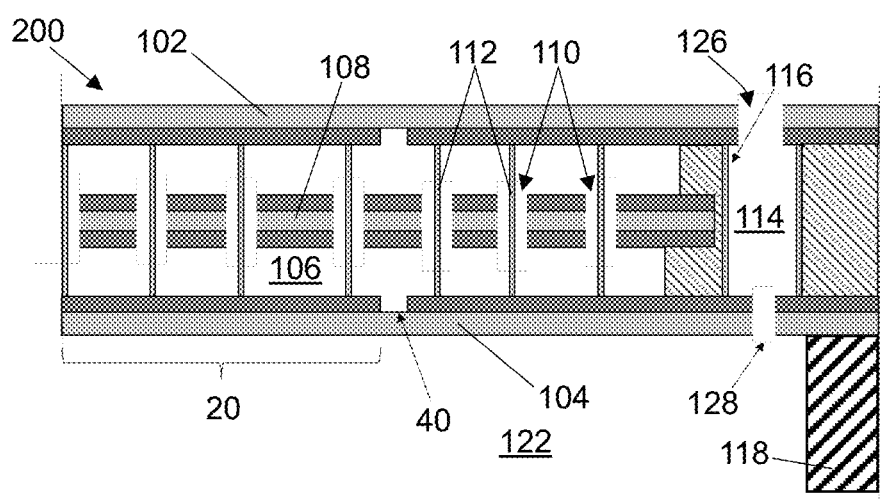
FIG. 3 is a cross-sectional schematic view of a MEMS die, according to another embodiment.

In an embodiment the second diaphragm 104 is attached to the substrate 118 over the opening 122 via a spacer layer 124. However, in an embodiment of the MEMS die 200 (see FIG. 3) at least a portion of the second diaphragm 104 is attached directly to the substrate 118. In some embodiments the spacer layer 124 can be an integral part of the substrate 118 or added onto the substrate 118 as an additional sacrificial layer 124. The spacer layer 124 can, for example, be made of any insulative material as described hereinabove. In an embodiment the substrate 118 is made of silicon. Still referring to FIGS. 1 and 2, in an embodiment the opening 122 of the substrate 118 at least partially overlaps vertically with the tunnel 114.

According to an embodiment, each of the conductive layers 102B and 104B includes a sensing or active region 20 and a non-sensing or inactive region 30. The sensing region 20 is disposed radially inward of and separated from the non-sensing region 30 by a gap 40 in the conductive layer 102B or 104B. The sensing region 20 and the gap 40 are visible in FIGS. 2, 3, 5, 8, 13, and 14.

Figure 4:
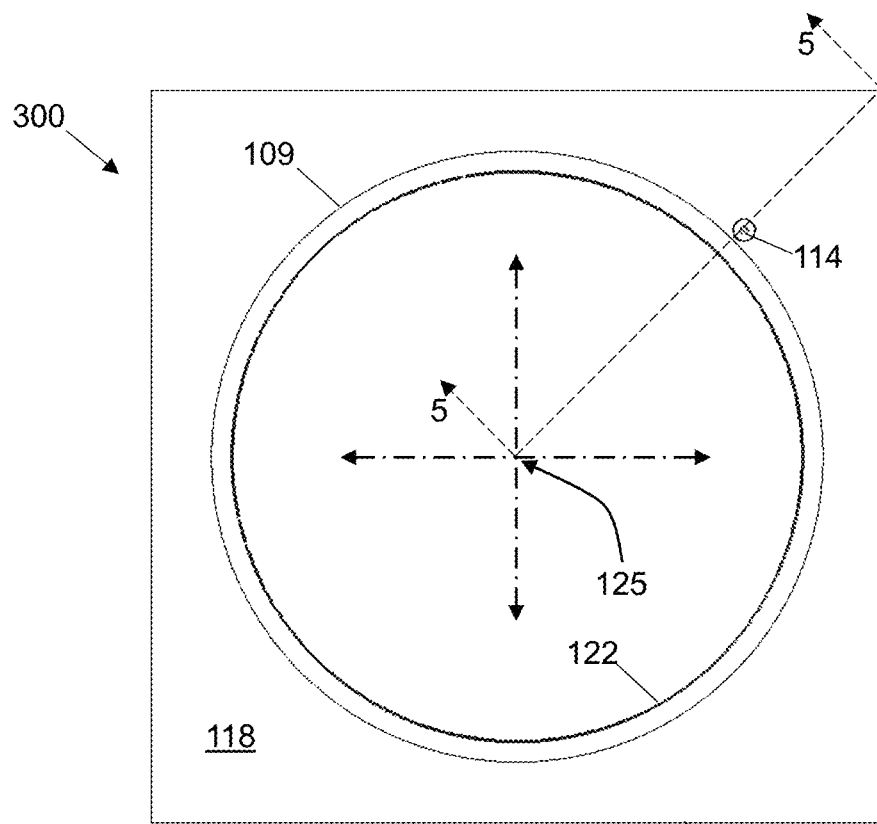
FIG. 4 is a top plan schematic view of a MEMS die, according to a further embodiment.
Figure 5:
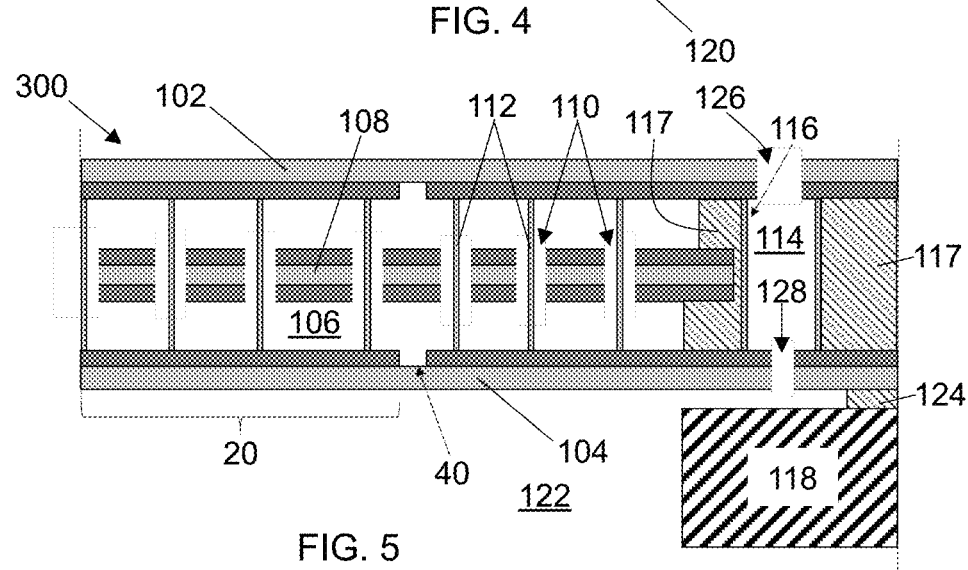
FIG. 5 is a cross-sectional schematic view of the MEMS die of FIG. 4 taken generally along the lines 5-5 of FIG. 4.

Referring to FIGS. 4 and 5, in an embodiment of a MEMS die 300, the opening 122 is offset from the tunnel 114. In this embodiment the tunnel 114 still provides fluid communication from the opening 122, through the second diaphragm 104, and through the first diaphragm 102. However, configuring the MEMS die 300 with the opening 122 offset from the tunnel 114 helps to inhibit the ingress of particles into the MEMS die 300.

Figure 6:
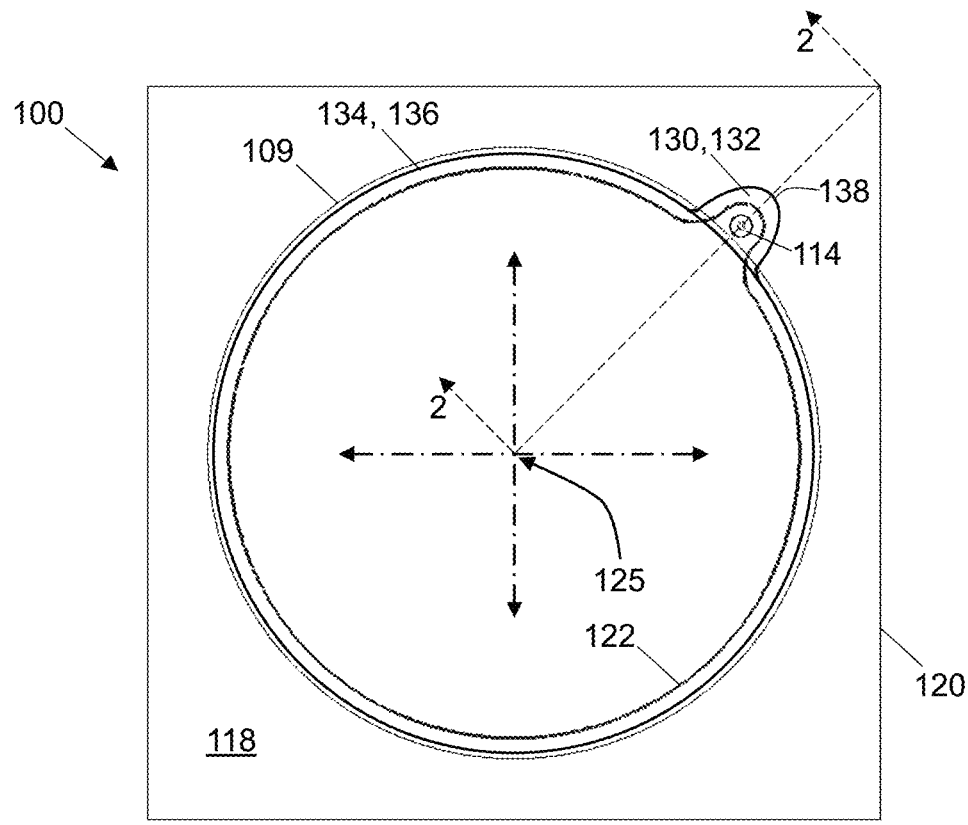
FIG. 6 is a top plan schematic view of the MEMS die of FIG. 1 showing additional structure.

FIG. 6 illustrates another schematic top plan view of the MEMS die 100. On this view, the generally circular elements 134, 136 represent the release fronts (the inner radial edges) of the material 117 disposed between the stationary electrode assembly 108 and the first and second diaphragms 102, 104, respectively. In FIG. 6, the release fronts 134, 136 are illustrated to overlap but in some embodiments the release fronts 134, 136 may have a slightly different size and not be overlapping (e.g., see FIG. 2). The radius of each of the release fronts 134, 136 is slightly less than the radius of the perimeter 109 of the stationary electrode assembly 108. In addition, the release front 138 (the inner radial edge) of the spacer layer 124 is illustrated on FIGS. 2, 6, and 7.

Referring to FIGS. 2 and 6 together, in an embodiment the first diaphragm 102 comprises an extension 130 that extends beyond the perimeter 109 of the stationary electrode assembly 108 (and thus beyond the perimeter of the stationary electrode or stationary electrodes of the stationary electrode assembly 108). Similarly, the second diaphragm 104 comprises an extension 132 that extends beyond the perimeter 109 of the stationary electrode assembly 108. The tunnel 114 passes through the extension 130 of the first diaphragm 102 and the extension 132 of the second diaphragm 104. As illustrated in FIG. 6, in an embodiment the release fronts 134, 136 of the material 117 disposed between the stationary electrode assembly 108 and the first and second diaphragms 102, 104, respectively, except for the extensions 130, 132, respectively, are both within the perimeter 109 of the stationary electrode assembly 108. The release front 138 of the spacer layer 124 disposed between the second diaphragm 104 and the substrate 118 is also illustrated in FIG. 6.

In the embodiment of the MEMS die 100 illustrated in FIGS. 1, 2 and 6 the tunnel 114 does not pass through the sealed chamber 106 or through a portion of the first and second diaphragms 102, 104 that is mechanically active. It is believed that such configuration of the tunnel 114 eliminates the mechanical robustness risk of failure of the side wall 116. Further, positioning the tunnel 114 as described above instead of through a center or other point in the sensing electrode region 20 results in a higher capacitance and a higher diaphragm compliance that are both due to maintaining a larger sensing region 20 lacking the structure of a tunnel 114 and a side wall 116 disposed within it.

Figure 7:
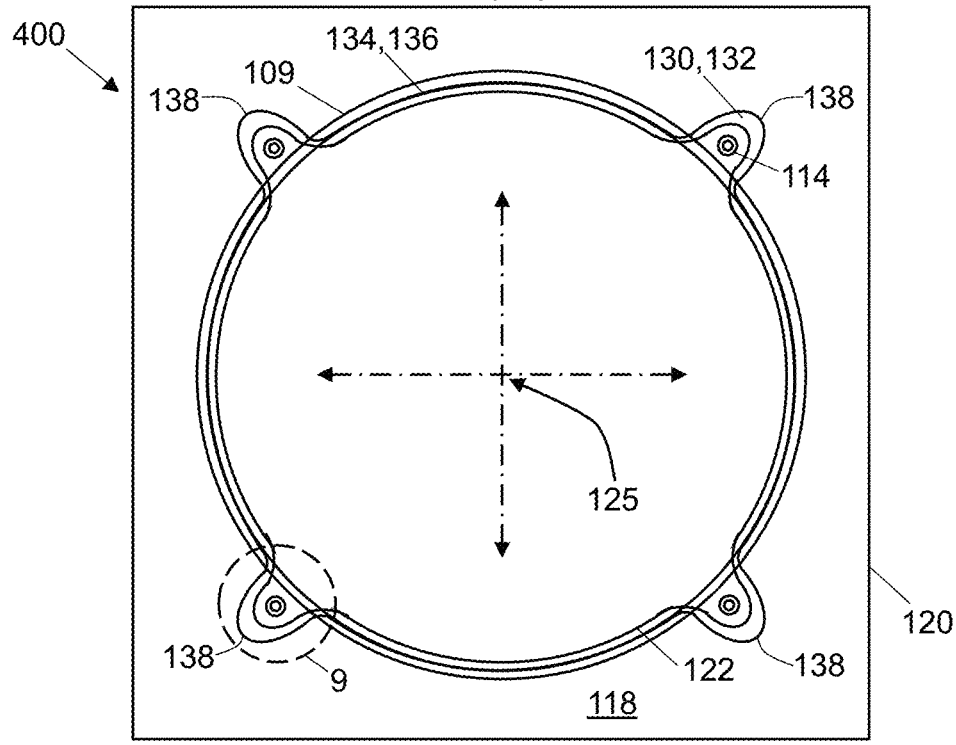
FIG. 7 is a top plan schematic view of a MEMS die, according to yet another embodiment.

In an embodiment of the MEMS die 400 as illustrated in FIG. 7, the tunnel 114 is one of a plurality of tunnels 114, for example without limitation four as shown, each of which passes through the first diaphragm 102 and the second diaphragm 104 without passing through the stationary electrode assembly 108 (i.e., without passing through the one or more stationary electrodes). Each of the plurality of tunnels 114 is sealed off from the sealed chamber 106, and each of the plurality of tunnels 114 provides fluid communication from the opening 122, through the second diaphragm 104, and through the first diaphragm 102. The plurality of tunnels 114 in other embodiments can number 2, 3, 4 as shown in FIG. 7, 5, 6, 7, 8, 9, 10 or more. Each of the plurality of tunnels 114 passes through the extension 130 of the first diaphragm 102 and the extension 132 of the second diaphragm 104. As illustrated in FIG. 7, the release fronts 134, 136 of the material 117 disposed between the stationary electrode assembly 108 and the first and second diaphragms 102, 104, respectively, except for the extensions 130, 132, respectively, are both within the perimeter 109 of the stationary electrode assembly 108 (i.e., within the perimeter of the one or more stationary electrodes). The release front 138 proximate to each of the plurality of tunnels 114 is also illustrated in FIG. 7.

Figure 8:
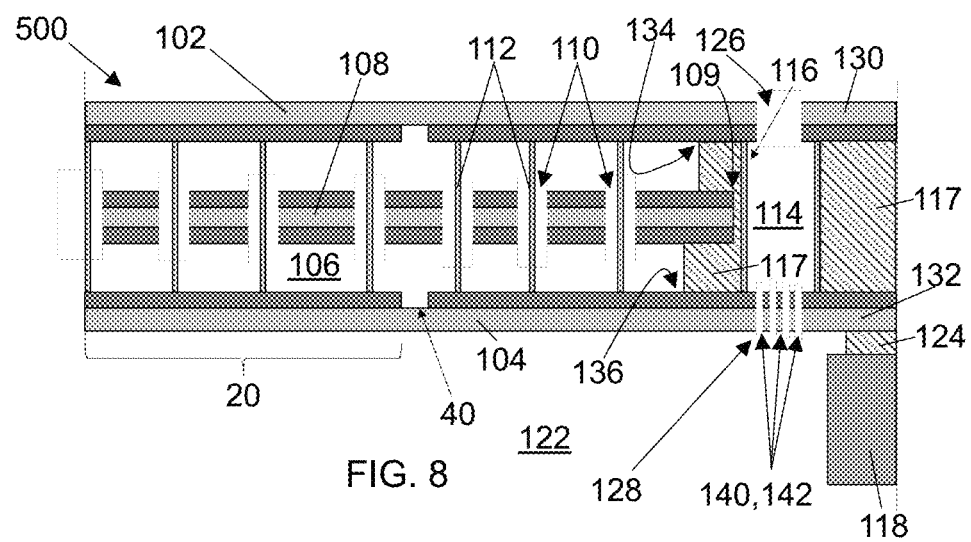
FIG. 8 is a cross-sectional schematic view of a MEMS die, according to a further embodiment.
Figures 9A, 9B:
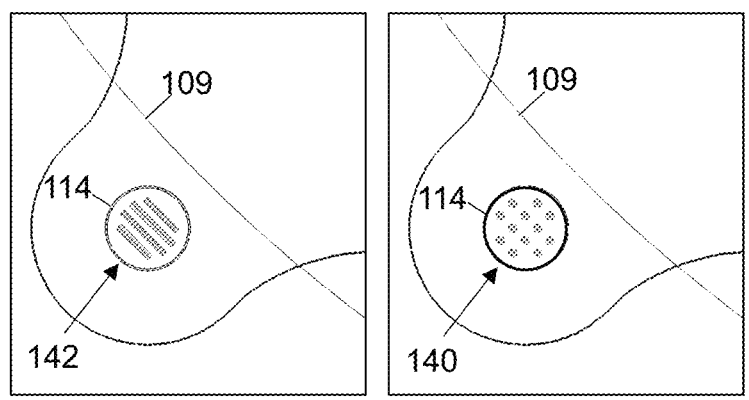
FIG. 9A is a top plan schematic view illustrating an expanded view of an embodiment of the portion of FIG. 7 within the dashed circle 9.
FIG. 9B is a top plan schematic view illustrating an expanded view of another embodiment of the portion of FIG. 7 within the dashed circle 9.

Referring again briefly to FIG. 5, a first end of the tunnel 114 includes an opening or pierce 126 disposed through the first diaphragm 102 and at a second end of the tunnel 114 includes an opening or pierce 128 disposed through the second diaphragm 104. In contrast, referring to the embodiment of the MEMS die 500 in FIG. 8, either of the openings disposed at the first or second end of the tunnel 114 has an opening that is restricted by a series of holes 140 or slots 142. For example, referring to FIGS. 9A and 9B, which show an exemplary enlarged top plan view of the region of FIG. 7 within the dashed circle 9, one or more of the plurality of tunnels 114 in some embodiments, has an opening that is restricted by a series of slots 142, for example as shown in FIG. 9A, or a series of holes 140, for example as shown in FIG. 9B. Referring to the slots 142 in FIG. 9A, in an exemplary embodiment the slots 142 are each about 3 microns wide and are encompassed within a circle having a diameter of about 30 microns. Referring to the holes 140 in FIG. 9B, in an exemplary embodiment there are twelve holes 140 that are each about 3 microns in diameter. The holes 140 and slots 142 need not be distributed, oriented, or sized as shown in FIGS. 9A and 9B but in fact may be sized, oriented, or distributed in any size, orientation, or distribution as desired. Further, although the holes/slots 140, 142 are shown in FIG. 8 as disposed through the second diaphragm 104, in other embodiments the holes/slots 140, 142 are disposed through the first diaphragm 102 or through both the first and second diaphragms 102, 104.

The inclusion of holes/slots 140, 142 at one or both ends of the tunnel 114 is believed to improve particle and liquid ingress protection as compared to a tunnel 114 lacking the holes/slots 140, 142. The holes/slots 140, 142 also provide for greater flexibility for processing the die after formation of the tunnel 114 because the smaller openings of the holes/slots 140, 142 help to prevent photoresist chemicals from flowing through the tunnel 114.

Figure 10A:
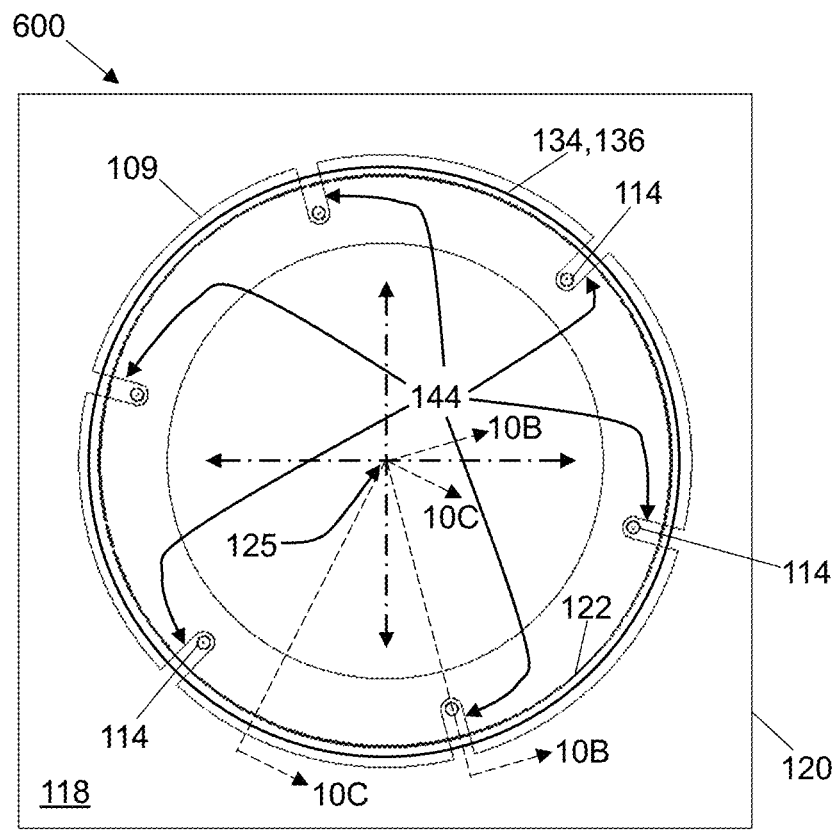
FIG. 10A is a top plan schematic view of a MEMS die, according to a still further embodiment.
Figure 10B:
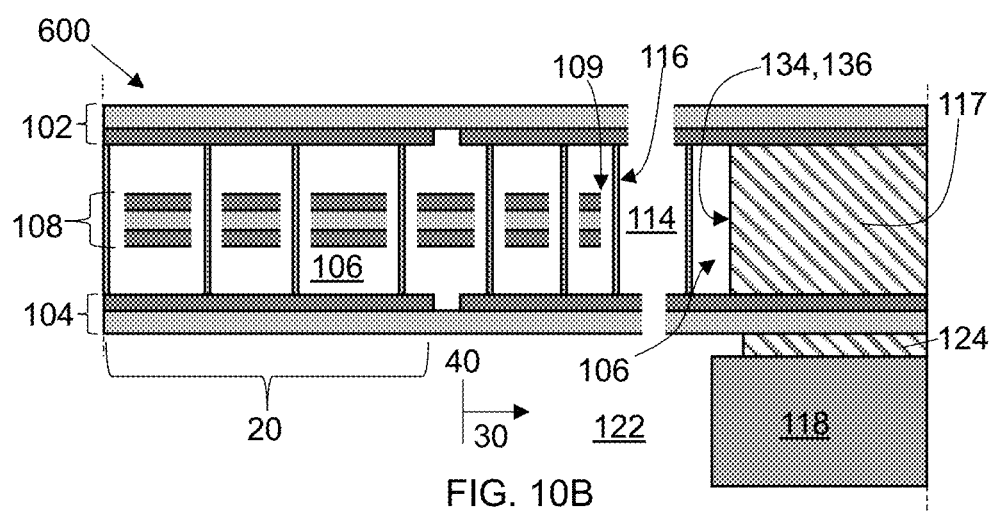
FIG. 10B is a cross-sectional schematic view of the MEMS die of FIG. 10A taken generally along the lines 10B-10B of FIG. 10A.
Figure 10C:
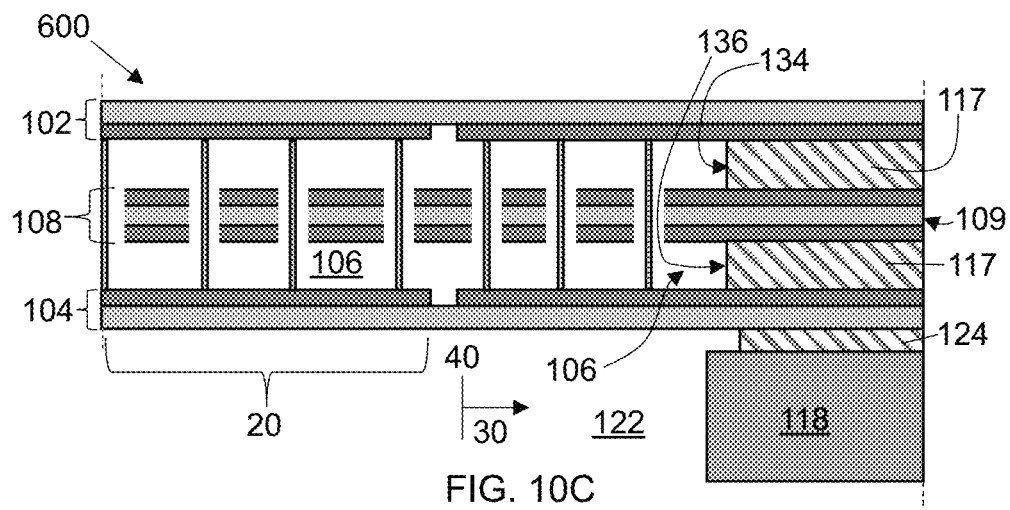
FIG. 10C is a cross-sectional schematic view of the MEMS die of FIG. 10A taken generally along the lines 10C-10C of FIG. 10A.

Referring to FIGS. 10A-10C, an embodiment of the MEMS die 600 includes a stationary electrode assembly 108 having one or more cutouts 144, wherein the perimeter 109 of the stationary electrode assembly 108 (i.e., the perimeter of the one or more stationary electrodes) on the cutouts is inside the release fronts 134, 136 of the material 117 disposed between the stationary electrode assembly 108 and the first and second diaphragms 102, 104, respectively. One or more tunnels 114 extend through the one or more cutouts 144. In this embodiment, the one or more tunnels pass through the first and second diaphragms 102, 104 without passing through the stationary electrode assembly 108, but unlike the embodiments above, in this embodiment the tunnel 114 also passes through the sealed chamber 106, meaning that the tunnel 114 is entirely surrounded by the sealed chamber 106, while being sealed off from the sealed chamber 106. Referring to FIG. 10B, which is a cross-sectional view of the MEMS die 600 taken through one of the cutouts 144, the tunnel 114 can be seen to be beyond the perimeter 109 of the stationary electrode assembly 108 while being surrounded by the sealed chamber 106. Referring to FIG. 10C, which is a cross-sectional view of the MEMS die 600 taken outside of one of the cutouts 144, the stationary electrode assembly 108 can be seen to be supported between the layers of material 117. Still referring to FIGS. 10A-10C, in an embodiment of the MEMS die 600 having a plurality of tunnels 114, each of the plurality of tunnels 114 passes through a cutout 144 of the plurality of cutouts 144.

Figure 10D:
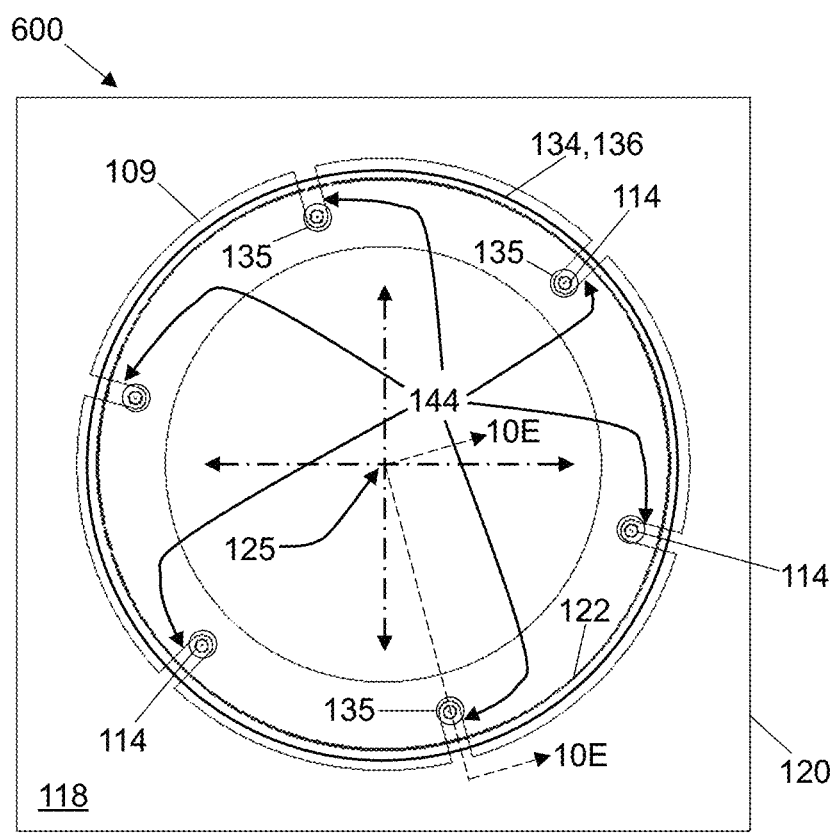
FIG. 10D is a top plan schematic view of a MEMS die, according to a yet another embodiment.
Figure 10E:
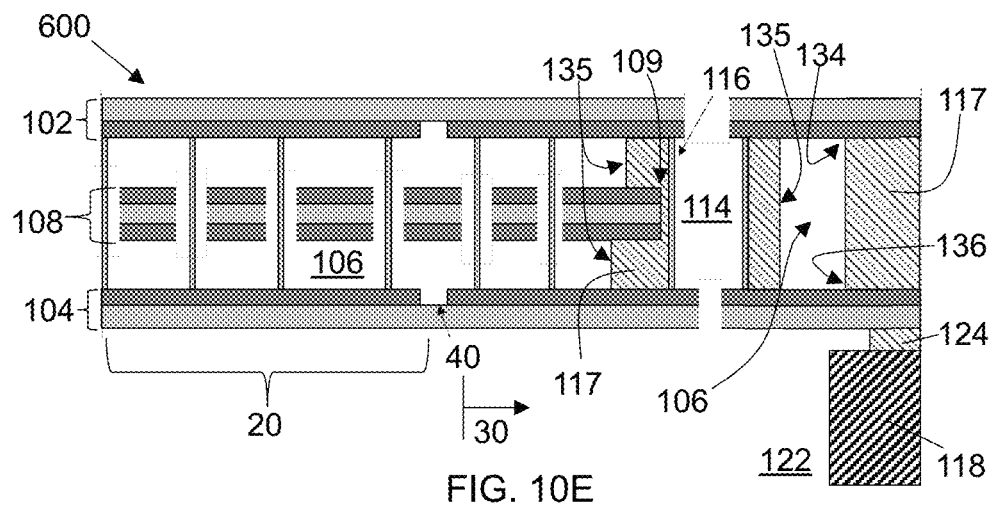
FIG. 10E is a cross-sectional schematic view of the MEMS die of FIG. 10D taken generally along the lines 10E-10E of FIG. 10D.

Referring to FIGS. 10D and 10E, in another embodiment of the MEMS die 600, each of the tunnels 114 is also surrounded by a release front 135 that represents an edge of the material 117 that surrounds each tunnel 114 between the stationary electrode assembly 108 and each of the first and second diaphragms 102, 104. In FIG. 10D, the release fronts 135 are illustrated as having one contour for clarity, but as shown in FIG. 10E, the contour of the release front 135 above the stationary electrode 108 can be different from the contour of the release front 135 below the stationary electrode 108.

Figure 10F:
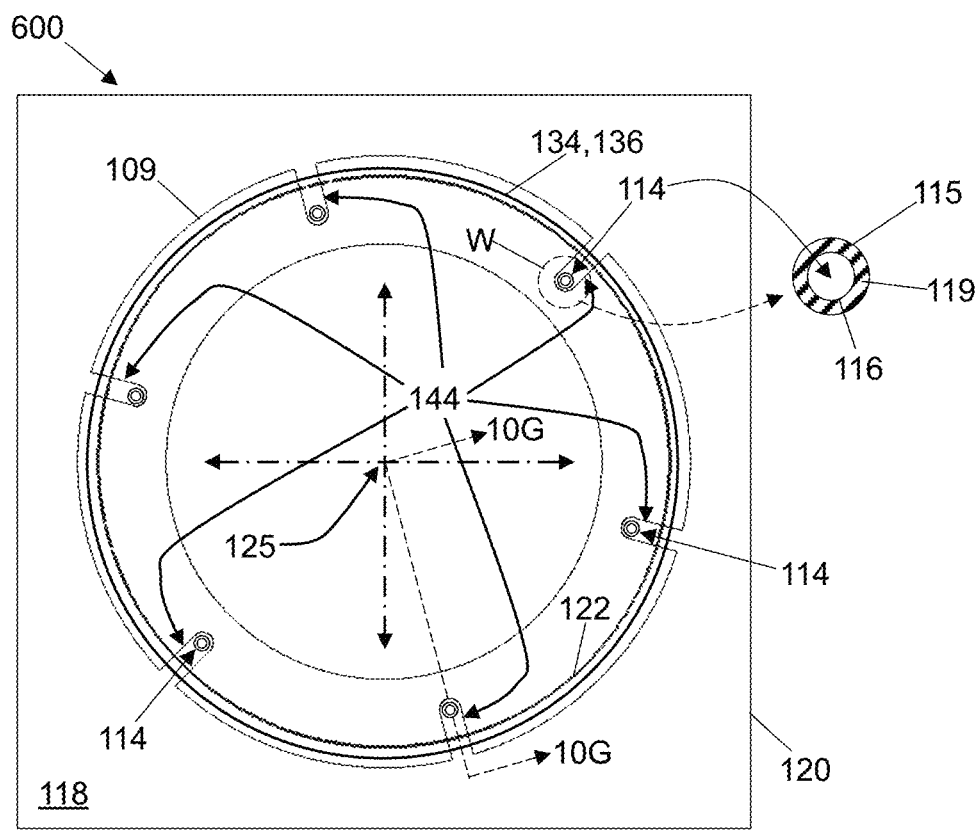
FIG. 10F is a top plan schematic view of a MEMS die, according to a yet further embodiment.
Figure 10G:
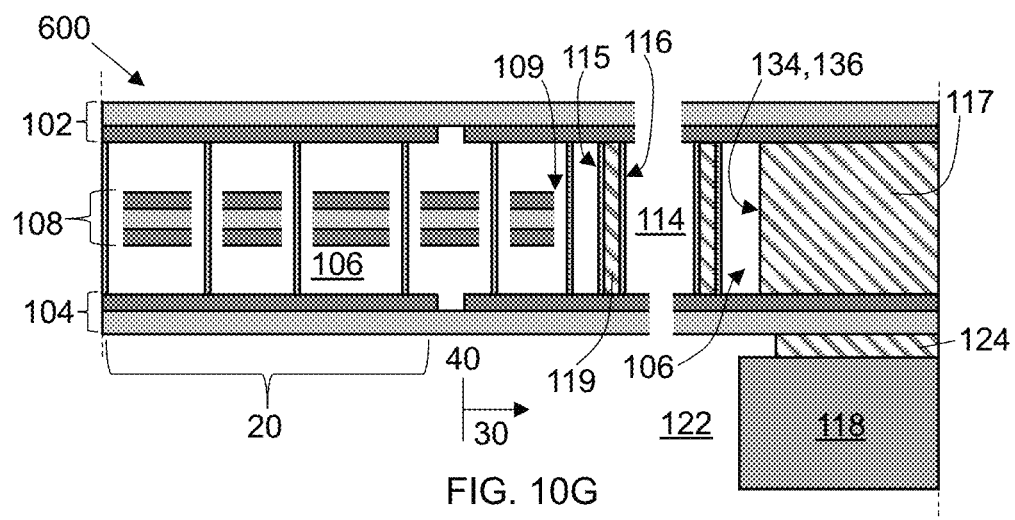
FIG. 10G is a cross-sectional schematic view of the MEMS die of FIG. 10F taken generally along the lines 10G-10G of FIG. 10F.

Referring to FIGS. 10F and 10G, in a further embodiment of the MEMS die 600, each of the tunnels 114 is surrounded by the first side 116 and a second side wall 115. The portion of FIG. 10F within the dashed circle labeled W has been enlarged to show the structure of the first and second side walls 116, 115. In this embodiment sacrificial material 119 is captured in the space between the first and second side walls 116, 115 and remains therebetween after the release step during production. This dual-walled tunnel 114 is thicker and therefore likely more robust than a single-walled tunnel 114.

Figure 11:
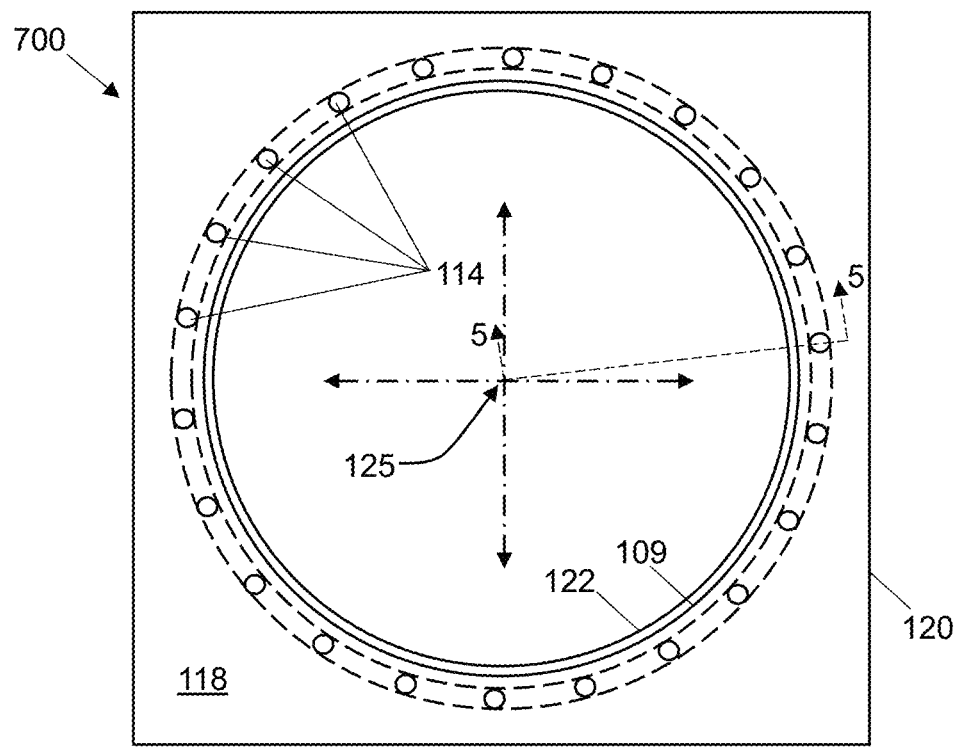
FIG. 11 is a top plan schematic view of a MEMS die, according to yet another embodiment.

Referring now to FIG. 11, an embodiment of the MEMS die 700 includes a plurality of tunnels 114 are distributed in a region disposed beyond a peripheral edge 109 of the stationary electrode assembly 108. The region is shown, for example, bounded by dashed lines in FIG. 11. In this embodiment the opening 122 of the substrate is offset from the plurality of tunnels 114 as is visible in the cross-sectional view of FIG. 5 which is taken generally along the lines 5-5 of FIG. 11. It is believed that disposing multiple possibly smaller tunnels 114 through the first and second diaphragms 102, 104 improves the particle and liquid ingress protection.

Figure 12:
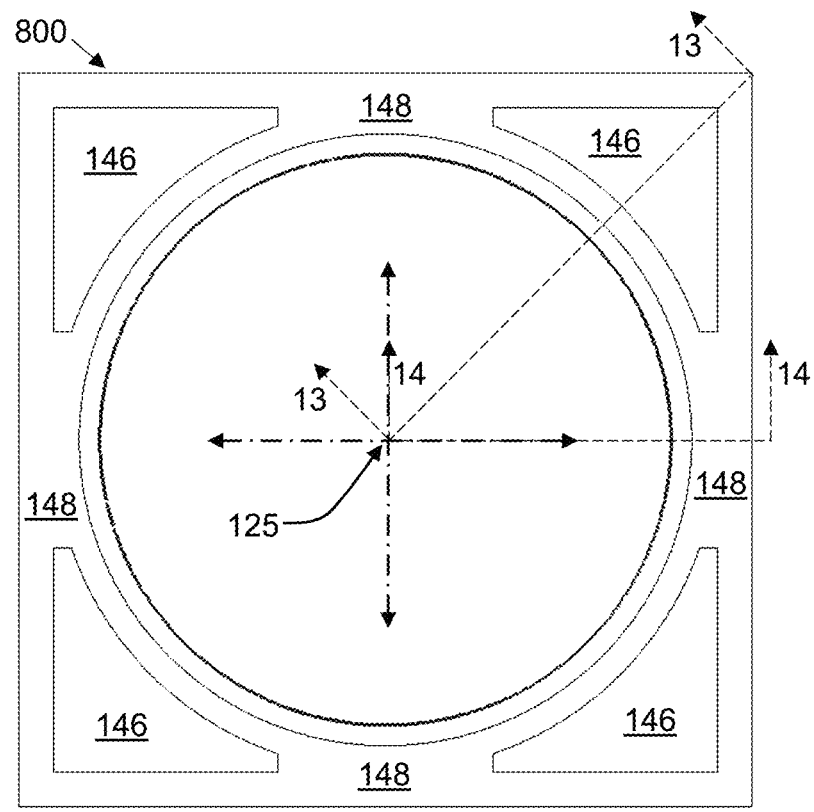
FIG. 12 is a top plan schematic view of a MEMS die, according to a further embodiment.
Figure 13:
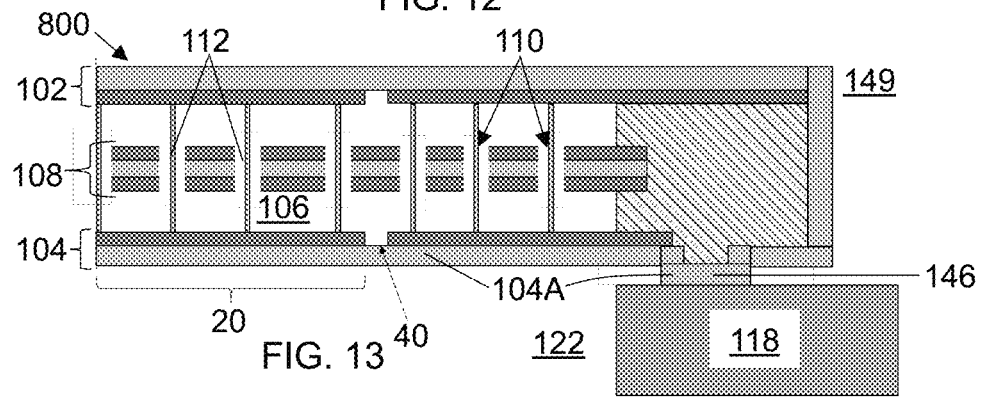
FIG. 13 is a cross-sectional schematic view of the MEMS die of FIG. 12 taken generally along the lines 13-13 of FIG. 12.
Figure 14:
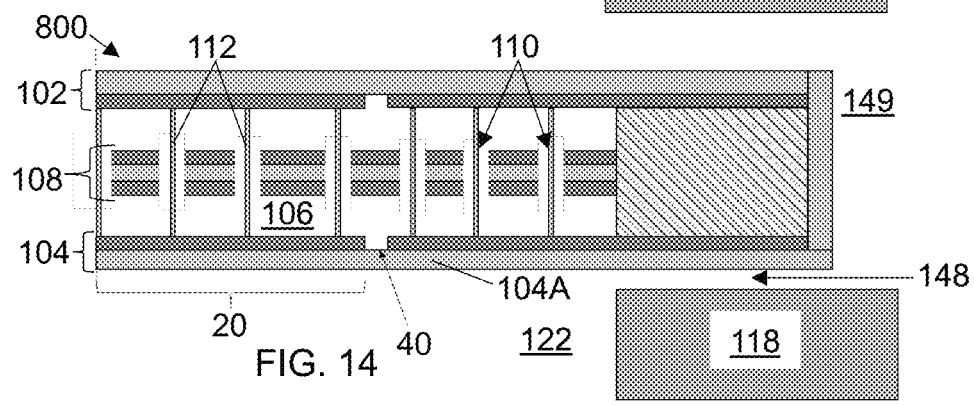
FIG. 14 is a cross-sectional schematic view of the MEMS die of FIG. 12 taken generally along the lines 14-14 of FIG. 12.

Referring to FIGS. 12-14, an embodiment of the MEMS die 800 includes a first diaphragm 102 and a second diaphragm 104, wherein the first diaphragm 102 and the second diaphragm 104 bound a sealed chamber 106. The MEMS die 800 further includes a substrate 118 having an opening 122 formed therethrough. In this embodiment a spacer layer 124 is disposed between the second diaphragm 104 and the substrate 118. However, in this embodiment the spacer layer 124 is selectively removed in one or more regions 146 so that the insulative material 104A contacts the substrate 118. Material of the spacer layer 124 remains in one or more regions 148 so that after the release step during production (which causes removal of the spacer layer 124) lateral tunnels are formed in the one or more regions 148. The lateral tunnels provide fluid communication between the opening 122 and a region 149 external to the MEMS die 800. The MEMS die 800 is believed to have improved particle and liquid ingress protection compared to embodiments described hereinabove having one or more tunnels 114.

During operation of any of the MEMS dies 100, 200, 300, 400, 500, 600, 700, 800 described hereinabove, for example as an acoustic transducer 100, electric charge is applied to the conductive layers 108B and 108C of the stationary electrode assembly 108 and the sensing regions 20 of the first and second movable electrodes 102B and 104B of the diaphragms 102, 104 thereby inducing an electric field between the stationary electrode(s) of the stationary electrode assembly 108 and the first and second movable electrodes 102B, 104B. Movement of the air (e.g., resulting from sound waves) pushes against the outer surface of the diaphragm 104 facing the opening 122 causing the first and second diaphragms 102, 104 to deflect (enter a deflection state) and to deform. This deformation causes a change in the capacitance between the one or more stationary electrodes of the stationary electrode assembly 108 and the first and second diaphragms 102, 104, which can be detected and interpreted as sound.

Figure 15:
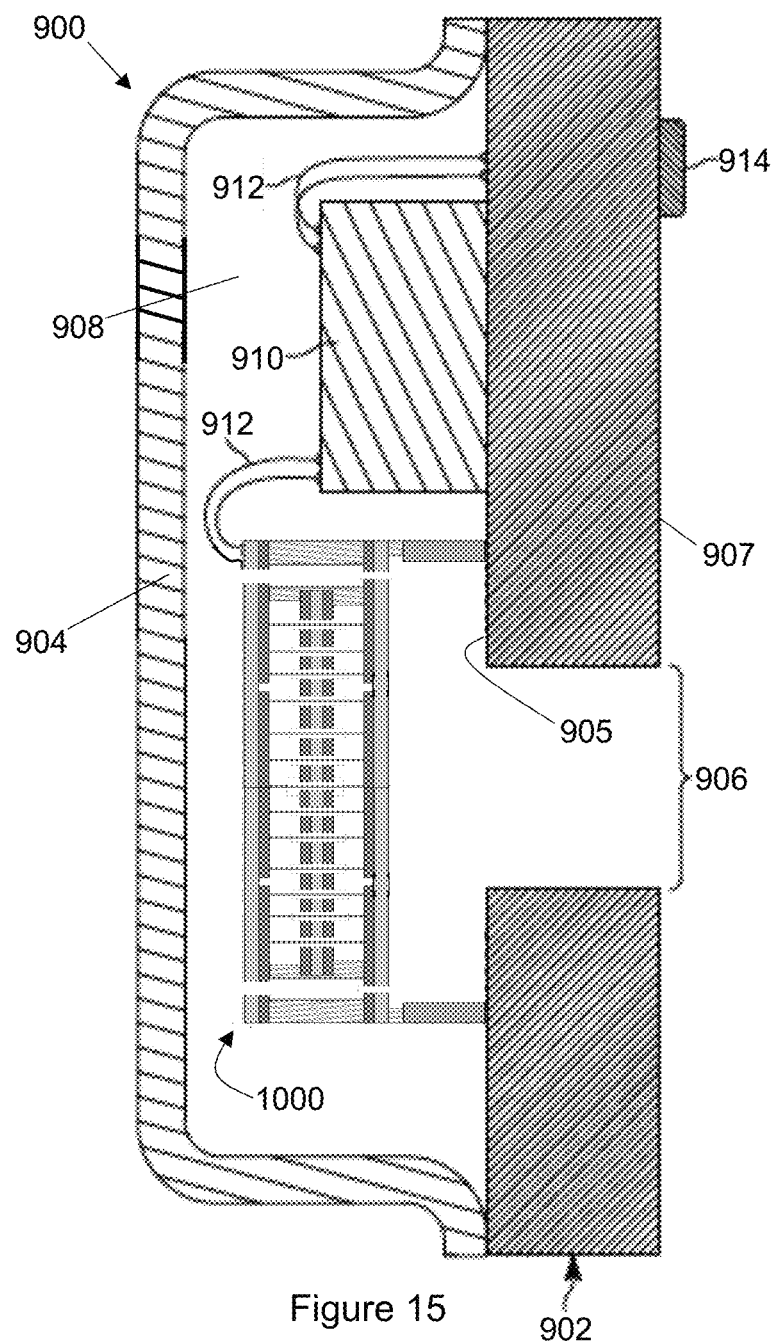
FIG. 15 is a cross-sectional view of a microphone assembly according to an embodiment.

Turning to FIG. 15, the MEMS die 100, 200, 300, 400, 500, 600, 700, 800 used as an acoustic transducer 1000 is configured to fit within a microphone assembly, generally labeled 900. The assembly 900 includes a housing including a base 902 having a first surface 905 and an opposing second surface 907. The housing further includes a cover 904 (e.g., a housing lid), and an acoustic port 906. In an embodiment the port 906 extends between the first surface 905 and the second surface 907. In one implementation, the base 902 is a printed circuit board. The cover 904 is coupled to the base 902 (e.g., the cover 904 may be mounted onto a peripheral edge of the base 902). Together, the cover 904 and the base 902 form an enclosed volume 908 for the assembly 900.

As shown in FIG. 15, the acoustic port 906 is disposed on the base 902 and is structured to convey sound waves to the MEMS acoustic transducer 1000 located within the enclosed volume 908. In other implementations, the acoustic port 906 is disposed on the cover 904 and/or a side wall of the cover 904. In some embodiments, the assembly 900 forms part of a compact computing device (e.g., a portable communication device, a smartphone, a smart speaker, an internet of things (IoT) device, etc.), where one, two, three or more assemblies may be integrated for picking-up and processing various types of acoustic signals such as speech and music.

The assembly 900 includes an electrical circuit disposed within the enclosed volume 908. In an embodiment, the electrical circuit includes an integrated circuit (IC) 910. In an embodiment the IC 910 is disposed on the first surface 905 of the base 902. The IC 910 may be an application specific integrated circuit (ASIC). Alternatively, the IC 910 may include a semiconductor die integrating various analog, analog-to-digital, and/or digital circuits. In an embodiment the cover 904 is disposed over the first surface 905 of the base 902 covering the MEMS acoustic transducer 1000 and the IC 910.

In the assembly 900 of FIG. 15, the MEMS acoustic transducer 1000 is illustrated as being disposed on the first surface 905 of the base 902. The MEMS acoustic transducer 1000 converts sound waves, received through acoustic port 906, into a corresponding electrical microphone signal, and generates an electrical signal (e.g., a voltage) at a transducer output in response to acoustic activity incident on the port 906. As shown in FIG. 15, the transducer output includes a pad or terminal of the transducer that is electrically connected to the electrical circuit via one or more bonding wires 912. The assembly 900 of FIG. 15 further includes electrical contacts, shown schematically as contacts 914, typically disposed on a bottom surface of the base 902. The contacts 914 are electrically coupled to the electrical circuit. The contacts 914 are configured to electrically connect the assembly 900 to one of a variety of host devices.

As noted hereinabove, a plurality of MEMS devices can be manufactured in a single batch process. Individual portions of the batch process representative of individual MEMS devices are known as dies. Accordingly, a number of MEMS dies can be manufactured in a single batch process and then cut apart or otherwise separated for further fabrication steps or for their ultimate use, which for example without limitation includes as an acoustic transducer or other portion of a microphone.

Steps in a production process utilized to produce any of the embodiments of the MEMS die 100, 200, 300, 400, 500, 600, 700, 800 as described hereinabove include etching, masking, patterning, cutting, boring, and/or release steps executed on a workpiece. All of the steps are not described in detail herein. However, generally the portions of the MEMS die 100 that ultimately end up as the structure of the vacuum sealed dual diaphragms and the one or more tunnels 114 are layered onto a workpiece using sacrificial material, or otherwise bored or etched out of a solid block of material.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

Unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microelectromechanical systems (MEMS) die, comprising:
    a first diaphragm;
    a second diaphragm, wherein the first diaphragm and the second diaphragm bound a sealed chamber;
    a stationary electrode disposed within the sealed chamber between the first diaphragm and the second diaphragm; and
    a tunnel that passes through the first diaphragm and the second diaphragm without passing through the stationary electrode, wherein the tunnel is sealed off from the chamber; and
    a substrate having an opening formed therethrough, wherein the tunnel provides fluid communication from the opening, through the second diaphragm, and through the first diaphragm.

2. The MEMS die of claim 1, wherein the tunnel is located farther out from a center of the MEMS die than an outer edge of the stationary electrode.

3. The MEMS die of claim 1, wherein the opening of the substrate is at least partially overlapped with the tunnel.

4. The MEMS die of claim 1, wherein the pressure within the sealed chamber is below 10,000 Pa.

5. The MEMS die of claim 1, wherein the substrate is coupled to at least a portion of the second diaphragm via sacrificial material.

6. The MEMS dies of claim 1, wherein at least a portion of the second diaphragm is attached directly to the substrate.

7. The MEMS die of claim 1, wherein the tunnel is defined by a wall, and at least a portion of the wall is surrounded by sacrificial material.

8. The MEMS die of claim 1, wherein the first diaphragm comprises a movable electrode and the second diaphragm comprises a movable electrode.

9. The MEMS die of claim 1,
    wherein the stationary electrode includes a plurality of apertures disposed therethrough,
    wherein the MEMS die further comprises a plurality of pillars, each having a first end connected to the first diaphragm and a second end connected to the second diaphragm, each pillar passing through an aperture of the plurality of apertures.

10. The MEMS die of claim 1, wherein
the first diaphragm comprises an extension that extends beyond the perimeter of the stationary electrode,
the second diaphragm comprises an extension that extends beyond the perimeter of the stationary electrode,
the tunnel passes through the extension of the first diaphragm and the extension of the second diaphragm.

11. The MEMS die of claim 10, wherein the perimeters of the first and second diaphragms except for the extensions are both within the perimeter of the stationary electrode.

12. The MEMS die of claim 1, wherein
the tunnel is one of a plurality of tunnels, each of which passes through the first diaphragm, through the chamber, and through the second diaphragm without passing through the stationary electrode, and is sealed off from the chamber,
each of the plurality of tunnels provides fluid communication from the opening, through the second diaphragm, and through the first diaphragm.

13. The MEMS die of claim 1, wherein
the tunnel is one of a plurality of tunnels,
the first diaphragm comprises a plurality of extensions, each of which extends beyond the perimeter of the stationary electrode,
the second diaphragm comprises a plurality of extensions, each of which extends beyond the perimeter of the stationary electrode,
each of the plurality of tunnels passes through an extension of the first diaphragm and an extension of the second diaphragm.

14. The MEMS die of claim 13, wherein
the perimeter of the first diaphragm except for the extensions of the first diaphragm is within the perimeter of the stationary electrode,
the perimeter of the second diaphragm except for the extensions of the first diaphragm is within the perimeter of the stationary electrode.

15. The MEMS die of claim 1, wherein
the stationary electrode has a cutout, wherein the perimeter of the stationary electrode on the cutout is inside the perimeter of the first diaphragm and is inside the perimeter of the second diaphragm,
the tunnel extends through the cutout.

16. The MEMS die of claim 1, wherein
the tunnel is one of a plurality of tunnels,
the stationary electrode has a plurality of cutouts, wherein the perimeter of the stationary electrode on the cutouts is inside the perimeter of the first diaphragm and inside the perimeter of the second diaphragm,
each of the plurality of tunnels passes through a cutout of the plurality of cutouts.

17. The MEMS die of claim 1, wherein the opening of the substrate is offset from the tunnel.

18. The MEMS die of claim 1, wherein an opening of the tunnel is restricted by a series of holes or slots.

* * * * *